United States Patent
Chwa et al.

(10) Patent No.: US 12,176,048 B2
(45) Date of Patent: Dec. 24, 2024

(54) ONE-TIME PROGRAMMABLE FUSE USING THIN FILM RESISTOR LAYER, AND RELATED METHOD

(71) Applicant: GlobalFoundries Singapore Pte. Ltd., Singapore (SG)

(72) Inventors: Siow Lee Chwa, Singapore (SG); Handoko Linewih, Singapore (SG); Yudi Setiawan, Singapore (SG); Qiying Wong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 202 days.

(21) Appl. No.: 18/145,341

(22) Filed: Dec. 22, 2022

(65) Prior Publication Data
US 2024/0212770 A1    Jun. 27, 2024

(51) Int. Cl.
*G11C 17/16* (2006.01)
*G11C 17/18* (2006.01)
*H01C 7/00* (2006.01)
*H01L 23/525* (2006.01)

(52) U.S. Cl.
CPC ............. *G11C 17/16* (2013.01); *G11C 17/18* (2013.01); *H01C 7/006* (2013.01); *H01L 23/5256* (2013.01)

(58) Field of Classification Search
CPC ........ G11C 17/16; G11C 17/18; H01C 7/006; H01L 23/5256
See application file for complete search history.

(56) References Cited

U.S. PATENT DOCUMENTS

| | | | |
|---|---|---|---|
| 5,340,775 A | 8/1994 | Carruthers et al. | |
| 6,171,922 B1 | 1/2001 | Maghsoudnia | |
| 8,169,811 B2 | 5/2012 | Li et al. | |
| 9,627,314 B2 * | 4/2017 | Choi | H01L 23/53252 |
| 9,893,011 B2 | 2/2018 | Bao et al. | |
| 2004/0227612 A1 | 11/2004 | Appel | |
| 2016/0027733 A1 | 1/2016 | Bao et al. | |

(Continued)

OTHER PUBLICATIONS

Brynsvold, "Constant-Current Stressing of SiCr-Based Thin-Film Resistors: Initial "Wearout" Investigation," IEEE Transaction on Device and Materials Reliability, 7:259-69, Jun. 2007, 11 pages.

(Continued)

*Primary Examiner* — Son L Mai
(74) *Attorney, Agent, or Firm* — Yee Tze Lim; Hoffman Warnick LLC

(57) ABSTRACT

A one-time programmable (OTP) fuse includes a fuse link including a thin film resistor (TFR) layer between a first insulator layer and a second insulator layer. A first terminal of the OTP fuse includes a first conductive pillar through one of the first and second insulator layers and in contact with the TFR layer; and a second terminal of the OTP fuse includes a second conductive pillar through one of the first and second insulator layers and in contact with the TFR layer. The second conductive pillar and the TFR layer have a lateral contact interface having a same shape as an outer portion of the second conductive pillar. The second conductive pillar does not simply land on the TFR layer, but extends through it. Application of a current to the OTP fuse results in programming via rupture of the lateral contact interface (not electromigration in the fuse link).

20 Claims, 16 Drawing Sheets

(56) References Cited

U.S. PATENT DOCUMENTS

2016/0118342 A1  4/2016  Choi et al.
2018/0166402 A1  6/2018  Sardesai et al.
2022/0165530 A1  5/2022  Leng

OTHER PUBLICATIONS

Khor et al., "Reliability Analysis of CrSi Thin Film Resistors," STMicroelectronics Pte Ltd, 4 pages.
Kothandaraman et al., "Electrically Programmable Fuse (eFUSE) Using Electromigration in Silicides," IEEE Electron Device Letters, 23:523-25, Sep. 2002, 3 pages.
Kwon et al., "Process Optimization of Integrated SiCr Thin-Film Resistor for High-Performance Analog Circuits," IEEE Transactions on Electron Devices, 61:8-14, Jan. 2014, 7 pages.
European Search Report for corresponding EP Application No. 23198241.4-1211 dated Mar. 14, 2024, 7 pages.

\* cited by examiner

ONE-TIME PROGRAMMABLE FUSE USING THIN FILM RESISTOR LAYER, AND RELATED METHOD

BACKGROUND

The present disclosure relates to semiconductor structures and, more particularly, to a one-time programmable fuse using a thin film resistor layer, and a related method of forming same.

Programmable devices, such as electronic fuses (e-fuses), are widely used elements found in various programmable integrated circuits (IC), such as redundancy circuits of dynamic random-access memories and static random-access memories, programmable logic devices, input/output circuits, built-in self-repair systems, and chip identification circuits. An e-fuse includes a pair of terminals and a narrow fuse link connecting the terminals, e.g., silicide in a front-end-of-line layer of an IC chip. When manufactured, an e-fuse is initially intact between the two terminals. E-fuses can be irreversibly programmed by passing an electric current through the fuse link to cause electromigration of the fuse link material. Once sufficient material has migrated, the fuse link is programmed (i.e., high resistance/blown), stopping/resisting current from passing through the e-fuse. One challenge presented by current e-fuses is that they require application of a relatively long and/or high-density current (e.g., 1 millisecond of approximately 10-12 milli-Amperes for a nickel/cobalt silicide e-fuse). Another challenge presented by current e-fuses is they occupy a large footprint in front-end-of-line layers of ICs due to the size of the fuse link and the associated current source needed to program them.

SUMMARY

All aspects, examples and features mentioned below can be combined in any technically possible way.

An aspect of the disclosure provides a one-time programmable (OTP) fuse, comprising: a fuse link including a thin film resistor (TFR) layer between a first insulator layer and a second insulator layer; a first terminal including a first conductive pillar through one of the first and second insulator layers and in contact with the TFR layer; and a second terminal including a second conductive pillar through one of the first and second insulator layers and in contact with the TFR layer, wherein the second conductive pillar and the TFR layer have a lateral contact interface having a same shape as an outer portion of the second conductive pillar.

An aspect of the disclosure provides a one-time programmable (OTP) fuse, comprising: a first insulator layer; a fuse link including a thin film resistor (TFR) layer over the first insulator layer; a second insulator layer over the thin film resistor layer; a first terminal including a first conductive pillar in contact with the TFR layer; a second terminal including a second conductive pillar in contact with the TFR layer, wherein the second conductive pillar has a circular cross-section with an inner portion extending through the TFR layer and an outer ring-shaped portion having a horizontal surface that contacts an upper, horizontal surface of the TFR layer; and an e-fuse driver below the second insulator layer.

An aspect of the disclosure provides a method of forming a one-time programmable (OTP) fuse, the method comprising: forming a first insulator layer; forming a thin film resistor (TFR) layer over the first insulator layer; forming a second insulator layer over the thin film resistor layer; forming a first conductive pillar in contact with the TFR layer; and forming a second conductive pillar in contact with the TFR layer, wherein the second conductive pillar and the TFR layer have a lateral contact interface having a same shape as an outer portion of the second conductive pillar.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
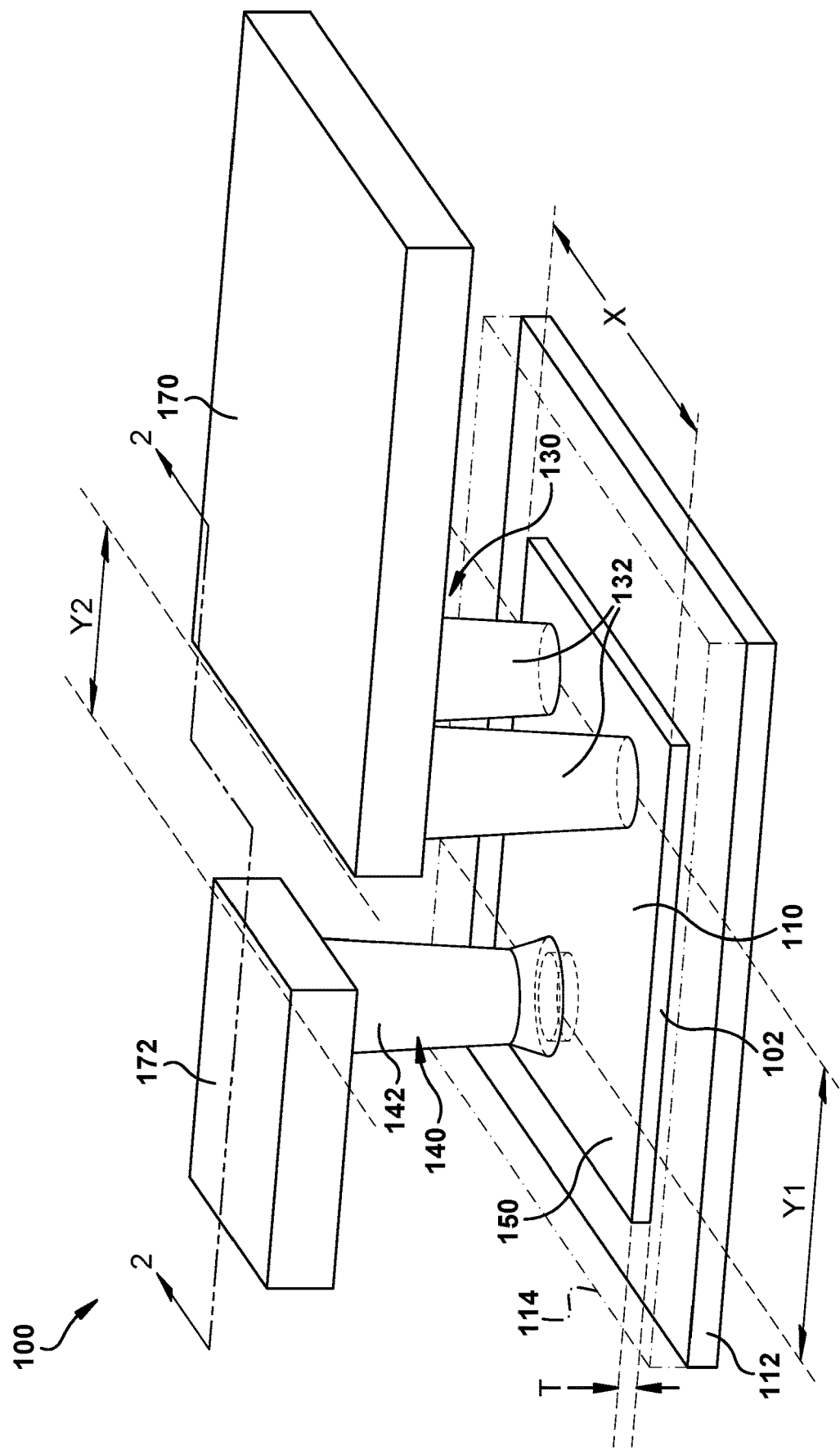
FIG. 1 shows a perspective view of a one-time programmable (OTP) fuse, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a one-time programmable (OTP) fuse. The OTP fuse includes a fuse link including a thin film resistor (TFR) layer between a first insulator layer and a second insulator layer. A first terminal of the OTP fuse includes a first conductive pillar through one of the first and second insulator layers and in contact with the TFR layer; and a second terminal of the OTP fuse includes a second conductive pillar through one of the first and second insulator layers and in contact with the TFR layer. The second conductive pillar and the TFR layer have a lateral contact interface having a same shape as an outer portion of the second conductive pillar, i.e., not the entire cross-section of the pillar. Further, the second conductive pillar does not simply land on the TFR layer but extends through it. Applying a current to the OTP fuse results in programming via rupture of the lateral contact interface (not electromigration in the fuse link). The OTP fuse can be formed in any back-end-of-line layer(s) rather than in a front-end-of-line (FEOL) layer of an IC chip, like current silicide-based OTP fuses, which makes the OTP fuse easier to fabricate and reduces the area required in the FEOL layer. The OTP fuse also requires lower current to program, e.g., approximately 2.5 milli-Amperes (mA) compared to 10-12 mA for silicide-based OTP fuses, which reduces the size of its e-fuse driver in the FEOL layer of the IC chip. The OTP fuse, including its driver, are also smaller in area compared to conventional silicide-based OTP fuses, allowing a higher density of them in a given IC chip.

Figure 2:
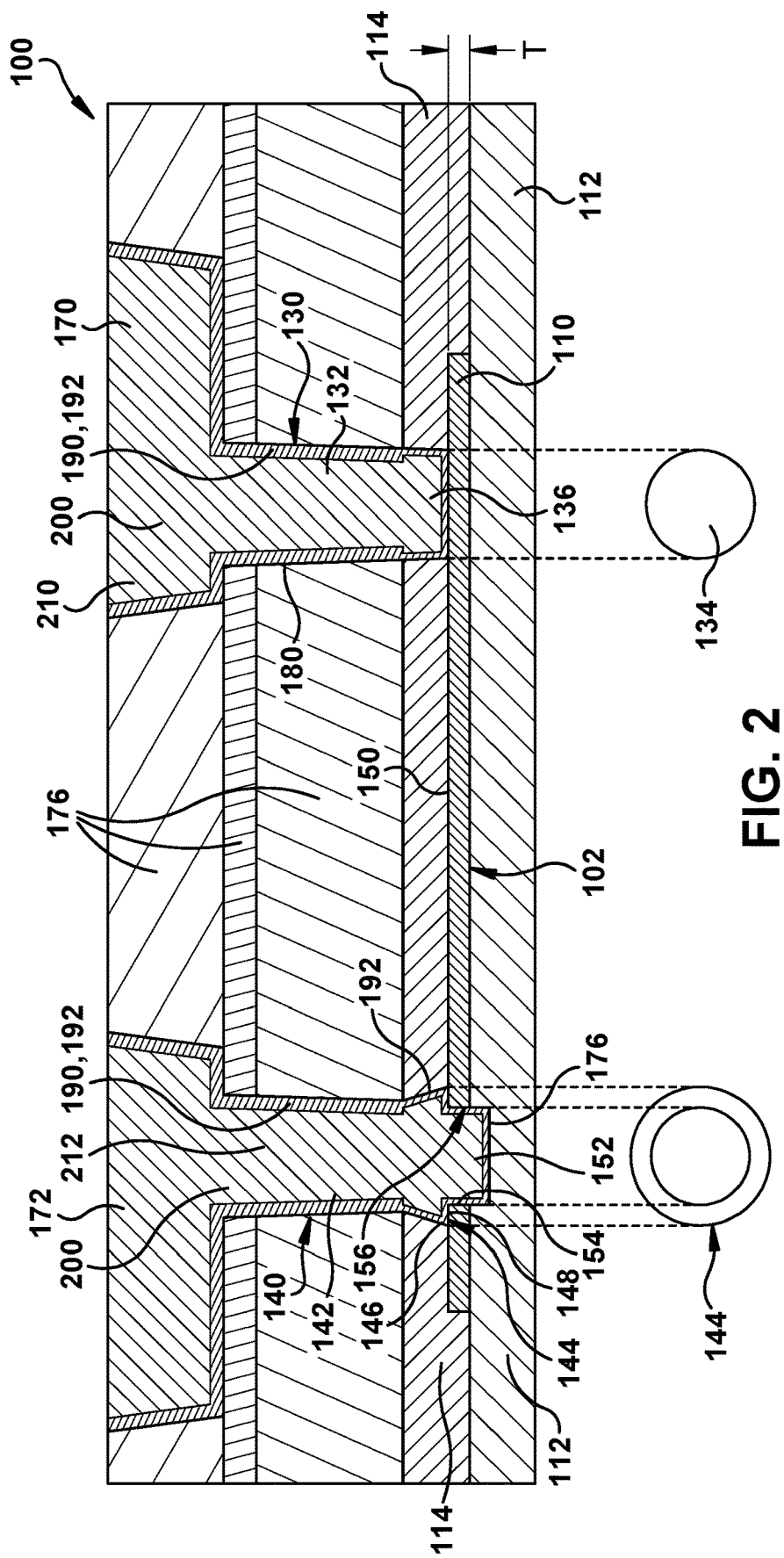
FIG. 2 shows a partially schematic and cross-sectional view of the OTP fuse along view line 2-2 in FIG. 1.
Figure 8:
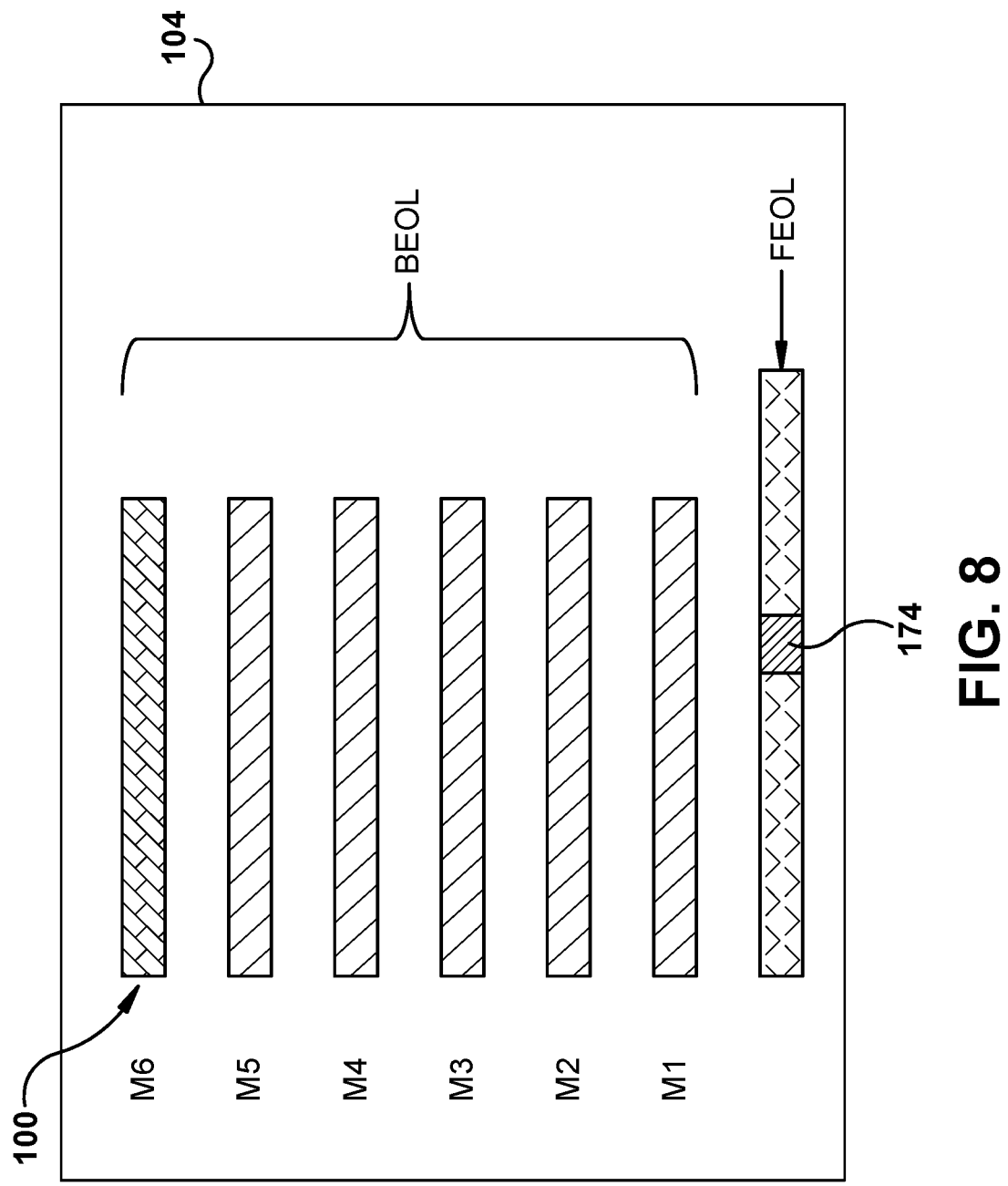
FIG. 8 show a schematic view of an integrated circuit (IC) chip including an OTP fuse, according to embodiments of the disclosure.

FIG. 1 shows a perspective view and FIG. 2 shows a partially schematic and cross-sectional view along view line 2-2 in FIG. 1 of a one-time programmable fuse 100, according to embodiments of the disclosure. One-time programmable fuse 100 (hereafter "fuse 100") may include a fuse link 102 including a thin film resistor (TFR) layer 110 between a first insulator layer 112 and a second insulator layer 114. Fuse 100 may be used in an IC chip 104 (FIG. 8). First insulator layer 112 and second insulator layer 114 may include any now known or later developed interlayer dielectric (ILD) material. Suitable ILD materials include but are not limited to: silicon nitride; silicon oxynitride; silicon carbon oxynitride; silicon dioxide; carbon-doped silicon dioxide materials; fluorinated silicate glass (FSG); organic polymeric thermoset materials; silicon oxycarbide; SiCOH dielectrics; fluorine doped silicon oxide; spin-on glasses, and any silicon-containing low-k dielectric. In certain embodiments, insulator layers 112, 114 may include silicon nitride, silicon oxynitride, or silicon carbon oxynitride.

TFR layer 110 may include any resistor material typically used to form thin film resistors. TFR layer 110 may include but is not limited to: silicon chromium (SiCr), copper nickel (CuNi), copper chromium (CuCr), nickel chromium (NiCr), titanium nitride (TiN), tantalum nitride (TaN), titanium carbide (TiC), silicon carbide (SiC), tungsten carbide (WC), cobalt (Co), nickel (Ni), chromium (Cr), tungsten (W), molybdenum (Mo), and tantalum (Ta). The listed materials may also include impurities typically added to thin film resistors such as oxygen ($O_2$), nitrogen (N), carbon (C), phosphorus (P), among others. TFR layer 110 may have a thickness T selected, in part, to define the required current to program fuse 100. In certain embodiments, TFR layer 110 may have a thickness of less than 30 nanometers, hence, "thin" as used herein means less than 30 nanometers. Other thicknesses are also possible.

Fuse 100 also includes a first terminal 130 including a first conductive pillar 132 through first or second insulator layer 112, 114 (second layer 114 as illustrated) and in contact with TFR layer 110, i.e., fuse link 102. Fuse 100 also includes a second terminal 140 including a second conductive pillar 142 through first or second insulator layer 112, 114 (second layer 114 as illustrated) and in contact with TFR layer 110, i.e., fuse link 102. Conductive pillars 132, 142 have different lateral contact interfaces 134, 144 with TFR layer 110. As used herein, "lateral contact interface" indicates a plane at which generally horizontal surfaces of each component meet. In this regard, first conductive pillar 132 of first terminal 130 is formed such that it lands on TFR layer 110. Hence, as shown in FIG. 2, first conductive pillar 132 of first terminal 130 has a lateral contact interface 134 with TFR layer 110 having a same shape as an entire cross-sectional shape of conductive pillar 132. As will be further described, in the example shown in FIG. 2, lateral contact surface 134 of first conductive pillar 132 has a solid circular shape.

In contrast, second conductive pillar 142 of second terminal 140 is formed to extend through TFR layer 110. As shown in FIG. 2, second conductive pillar 142 and TFR layer 110 have a lateral contact interface 144 having a same shape as only an outer portion 146 of second conductive pillar 142, where it extends through and contacts TFR layer 110. More particularly, outer portion 146 of second conductive pillar 142 includes a horizontal surface 148 that contacts an upper, horizontal surface 150 of TFR layer 110. Second conductive pillar 142 also includes an inner portion 152 extending through TFR layer 110.

In the example shown in FIG. 2, both conductive pillars 132, 142 have circular cross-sectional shapes. Hence, as noted previously, first lateral contact interface 134 of first conductive pillar 132 is a solid circle. However, second lateral contact interface 144 is ring-shaped, i.e., circular with an open center. In certain embodiments, inner (punch-through) portion 152 of second conductive pillar 142 may also contact an inner surface 154 of opening 156 in TFR layer 110, creating an L-shaped contact surface 158. However, this is not necessary in all cases, i.e., inner portion 152 of second conductive pillar 142 may simply extend through TFR layer 110 without extensive electrical contact.

Terminals 130, 140 may also include respective metal wires 170, 172 coupled to respective conductive pillars 132, 142. As understood in the art, metal wires 170, 172 may electrically couple to any variety of additional wires and/or contacts (e.g., through lower BEOL layers) to operatively couple fuse 100 to an e-fuse driver 174, i.e., driver circuitry, in an FEOL layer of an IC chip 104 (see FIG. 8) that controls operation of fuse 100. As also understood in the art, electrical connections to the device (not shown), e.g., a memory cell, that employs fuse 100 can connect to fuse link 102. Programming of fuse 100 electrically disconnect those electrical connections.

Figure 3:
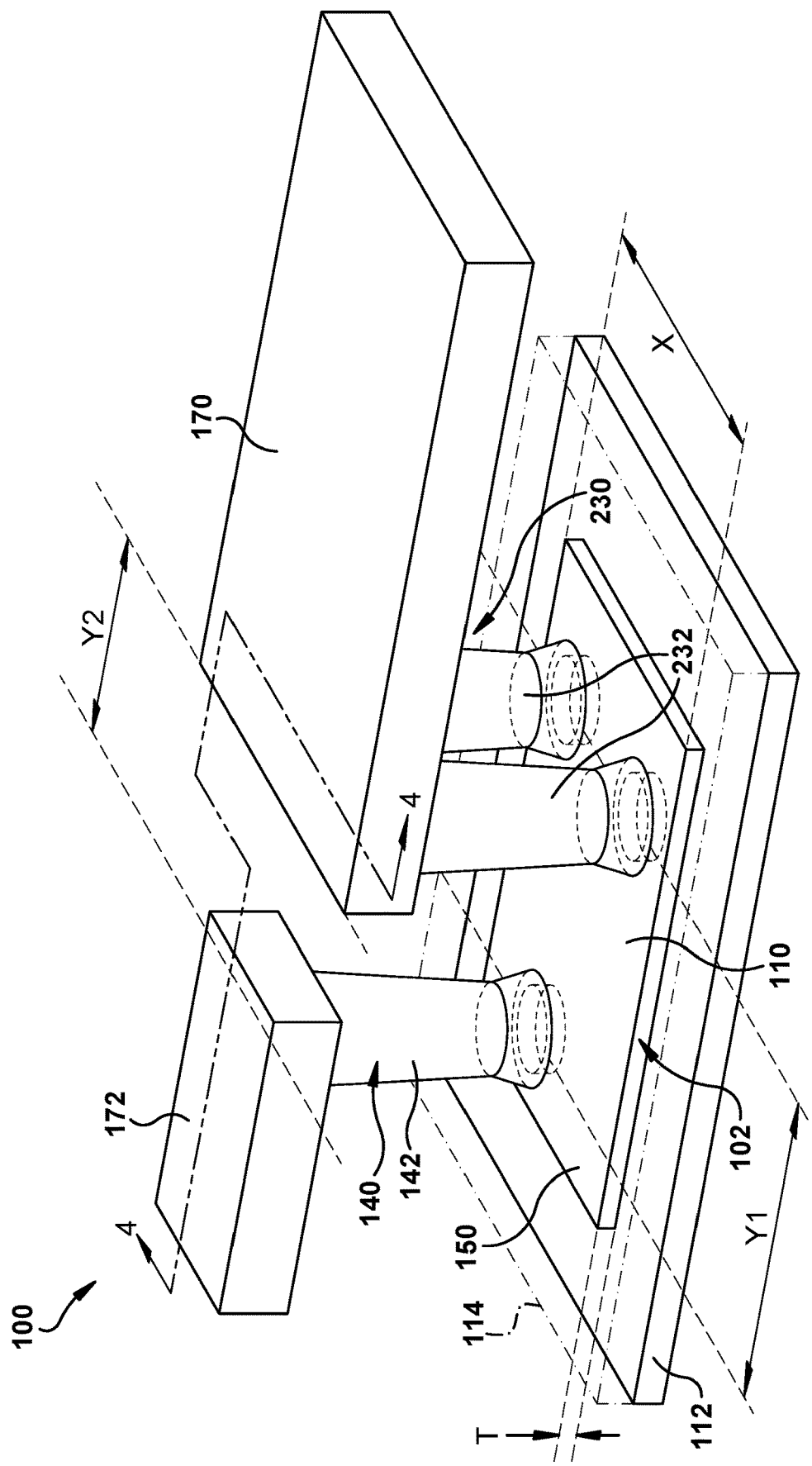
FIG. 3 shows a perspective view of a one-time programmable (OTP) fuse, according to other embodiments of the disclosure.
Figure 4:
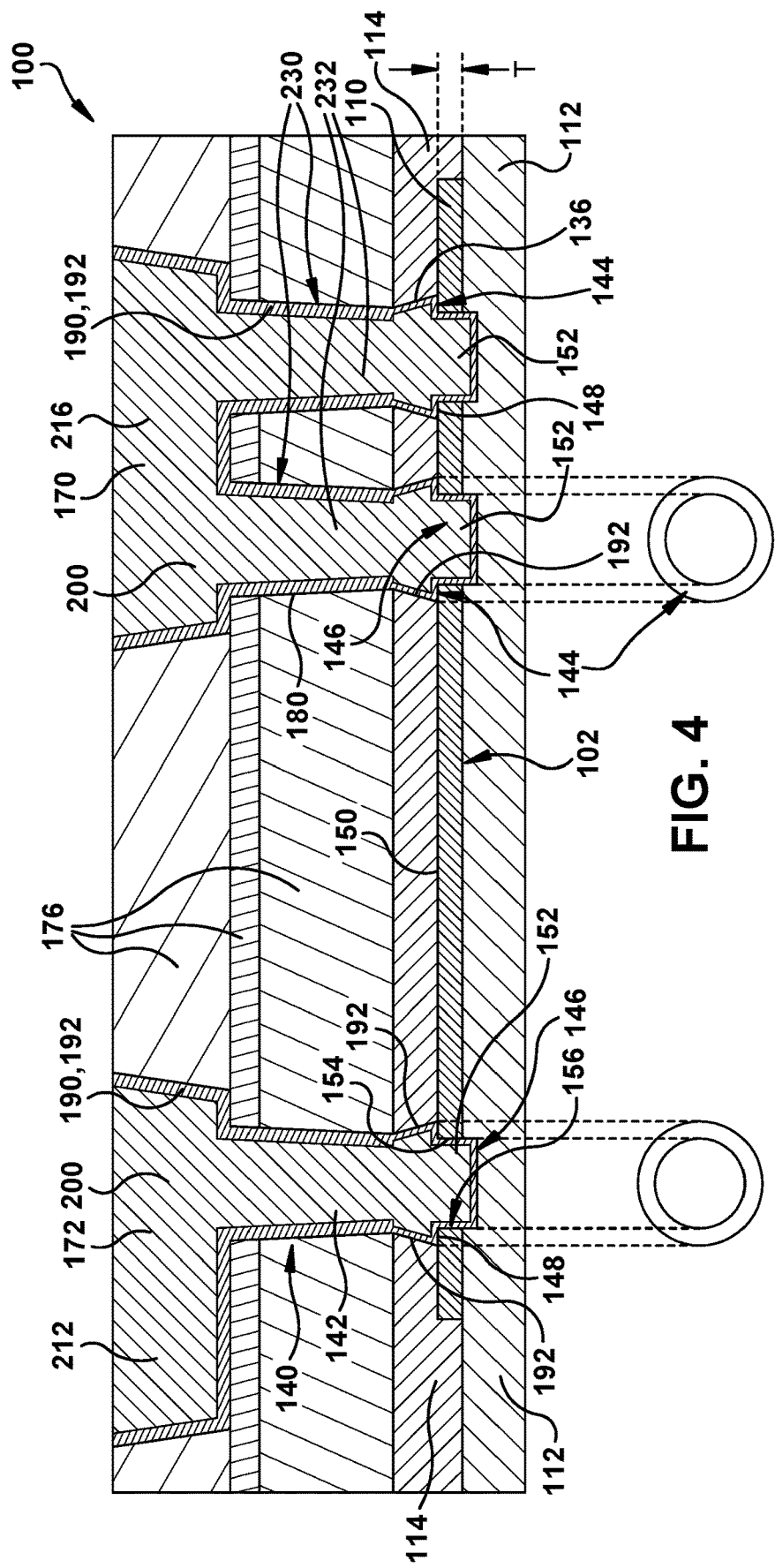
FIG. 4 shows a partially schematic and cross-sectional view of the OTP fuse along view line 4-4 in FIG. 3.

FIG. 3 shows a perspective view and FIG. 4 shows a partially schematic and cross-sectional view along view line 4-4 in FIG. 3 of fuse 100, according to other embodiments of the disclosure. Fuse 100 in this embodiment is substantially similar to that of FIGS. 1-2, except a first terminal 230 includes lateral contact interface 144 like second terminal 140 in FIGS. 1-2. Here, fuse 100 may include fuse link 102 including TFR layer 110 between first insulator layer 112 and second insulator layer 114. Fuse 100 also includes first terminal 230 including first conductive pillar 232 through first or second insulator layer 112, 114 (second layer 114 as illustrated) and in contact with TFR layer 110, i.e., fuse link 102. Fuse 100 also includes second terminal 140 including second conductive pillar 142 through first or second insulator layer 112, 114 (second layer 114 as illustrated) and in contact with TFR layer 110, i.e., fuse link 102. In FIGS. 3-4, conductive pillars 232, 142 have the same (or substantially the same) lateral contact interfaces 144 with TFR layer 110. Here, first conductive pillar 232 of first terminal 230 and second conductive pillar 142 of second terminal 140 are formed to extend through TFR layer 110. As shown in FIG. 4, first conductive pillar 232 and TFR layer 110 and second conductive pillar 142 and TFR layer 110 both have lateral contact interface 144 having a same shape as only outer portion 146 of the respective conductive pillars 232, 142, where they extend through and contact TFR layer 110. More particularly, outer portions 146 of first conductive pillar 232 and second conductive pillar 142 each include horizontal surface 148 that contacts upper, horizontal surface 150 of TFR layer 110. First conductive pillar 232 and second conductive pillar 142 also each include inner portion 152 extending through TFR layer 110.

In FIGS. 3 and 4, fuse 100 is shown with first terminal 230 including two conductive pillars 232 and second terminal 140 including one conductive pillar 142. However, any number of conductive pillars 232, 142 may be used in each terminal 230, 140, e.g., one or more than two.

In the example shown in FIG. 2, conductive pillars 132 and 142 have circular cross-sectional shapes. Hence, as noted previously, first lateral contact interface 134 of first conductive pillar 132 is a solid circle. Similarly, in FIG. 4, conductive pillars 232 and 142 have circular cross-sectional shapes. Hence, each second lateral contact interface 144 is ring-shaped, i.e., circular with an open center. In certain embodiments, inner (punch-through) portion 152 of first conductive pillar 232 (FIG. 4) and/or second conductive pillar 142 (FIG. 2) may also contact an inner surface 154 of opening 156 in TFR layer 110, creating an L-shaped contact surface 158. However, this is not necessary in all cases, i.e., inner portion 152 of second conductive pillar 142 may simply extend through TFR layer 110 without extensive electrical contact.

Terminals 230, 140 may also include respective metal wires 170, 172 coupled to respective conductive pillars 232, 142. As noted previously, metal wires 170, 172 may electrically couple to any variety of additional wires and/or contacts (e.g., through lower BEOL layers) to operatively couple fuse 100 to an e-fuse driver 174, i.e., driver circuitry, in an FEOL layer of an IC chip 104 (see FIG. 8) that controls operation of fuse 100. As also understood in the art, electrical connections to the device (not shown), e.g., a memory cell, that employs fuse 100 can connect to fuse link 102. Programming of fuse 100 electrically disconnect those electrical connections.

FIGS. 5A-F show cross-sectional views of forming fuse 100 according to embodiments of the disclosure. FIGS. 5A-F show forming the structure of FIGS. 1-2. It will be recognized by those with skill in the art however that the processing shown and described relative to second conductive pillar 142 on the left side of FIGS. 5A-F can be repeated on the right side to form first conductive pillar 232 as shown in FIGS. 3-4.

Figure 5A:
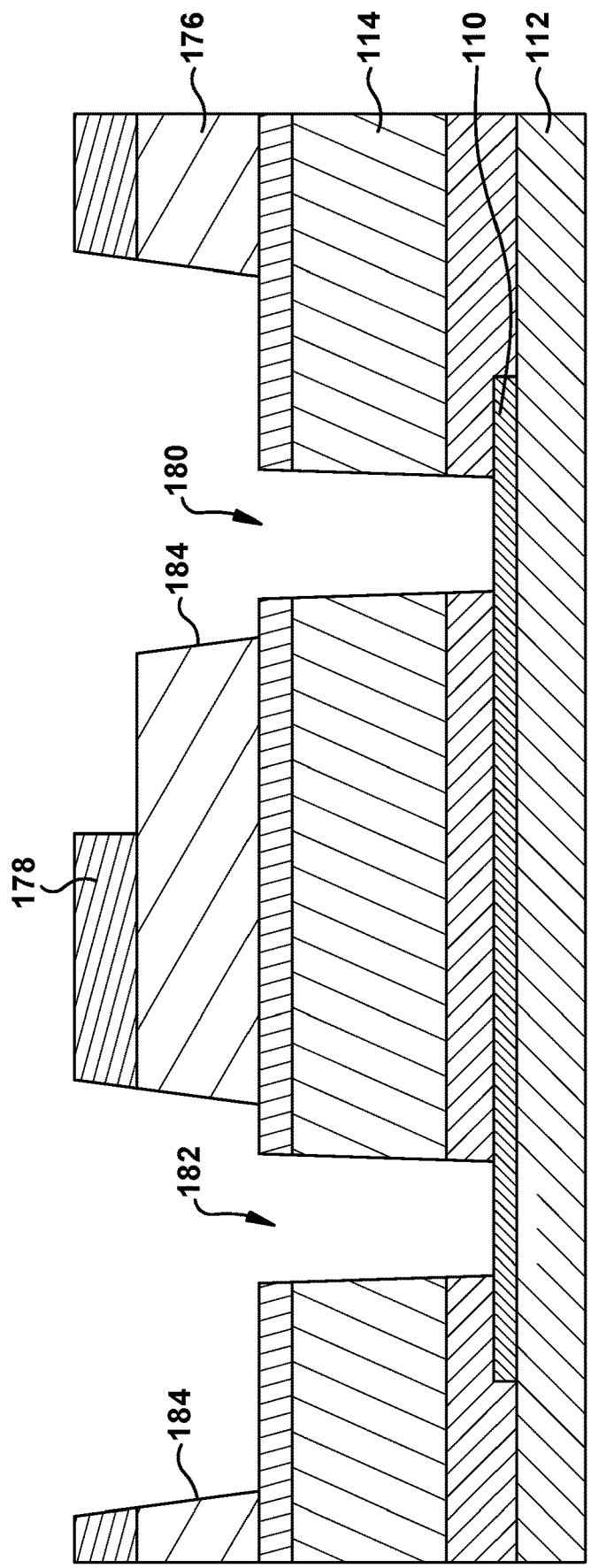
FIGS. 5A-F show cross-sectional views of a method of forming the OTP fuse, according to embodiments of the disclosure.

FIG. 5A shows the structure after forming first insulator layer 112, forming TFR layer 110 over first insulator layer 112, and forming second insulator layer 114 over TFR layer 110. Insulator layers 112, 114 and TFR layer 110 may be formed using any deposition technique appropriate for the particular material, e.g., chemical vapor deposition, atomic layer deposition, etc., over any desired back-end-of-line (BEOL) dielectric layer (not shown). Hence, fuse 100 is not formed in the FEOL layer (FIG. 8) in which IC devices, such as transistors, are formed, which frees space for such devices and provides more area for formation of fuse 100.

Conductive pillars 132, 142 may be formed using semiconductor fabrication techniques for forming contacts, also known as vias, through dielectric material, e.g., second insulator layer 114 and any additional ILD layer 176 thereover. For example, as also shown in FIG. 5A, a patterned mask 178 may be formed over second insulator layer 112 or any additional ILD layer 176 thereover, and an etching, such as reactive ion etching (RIE), can be performed to form openings 180, 182 for first and second conductive pillars, respectively. Mask 178 may include any now known or later developed masking material. Openings 180, 182 may or may not include upper portions 184 for metal wires 170, 172 (FIGS. 1-2) to connect with conductive pillars 132, 142 (FIG. 2). The etching creates openings 180, 182 that expose TFR layer 110.

Figure 5B:
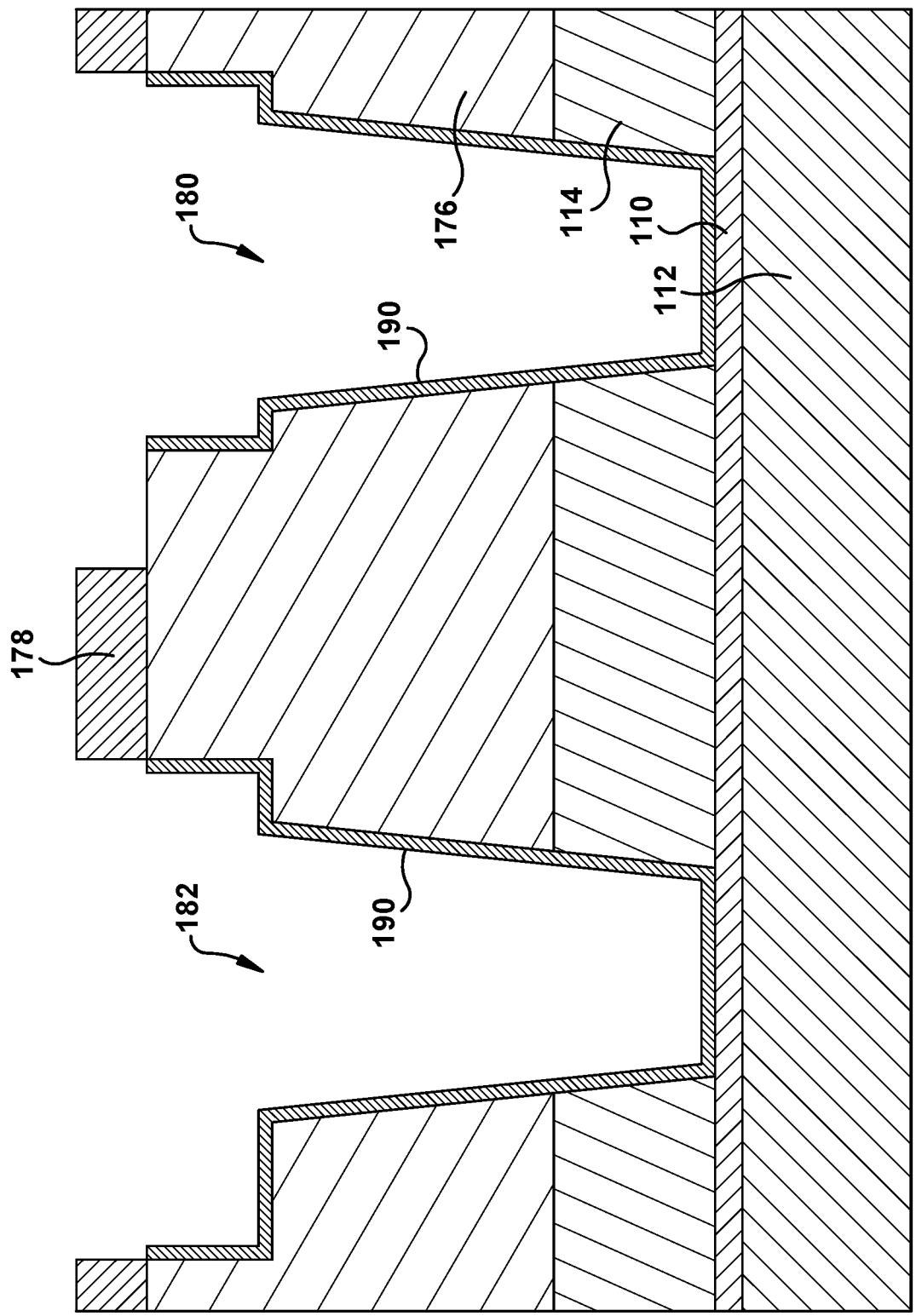
Figure 5C:
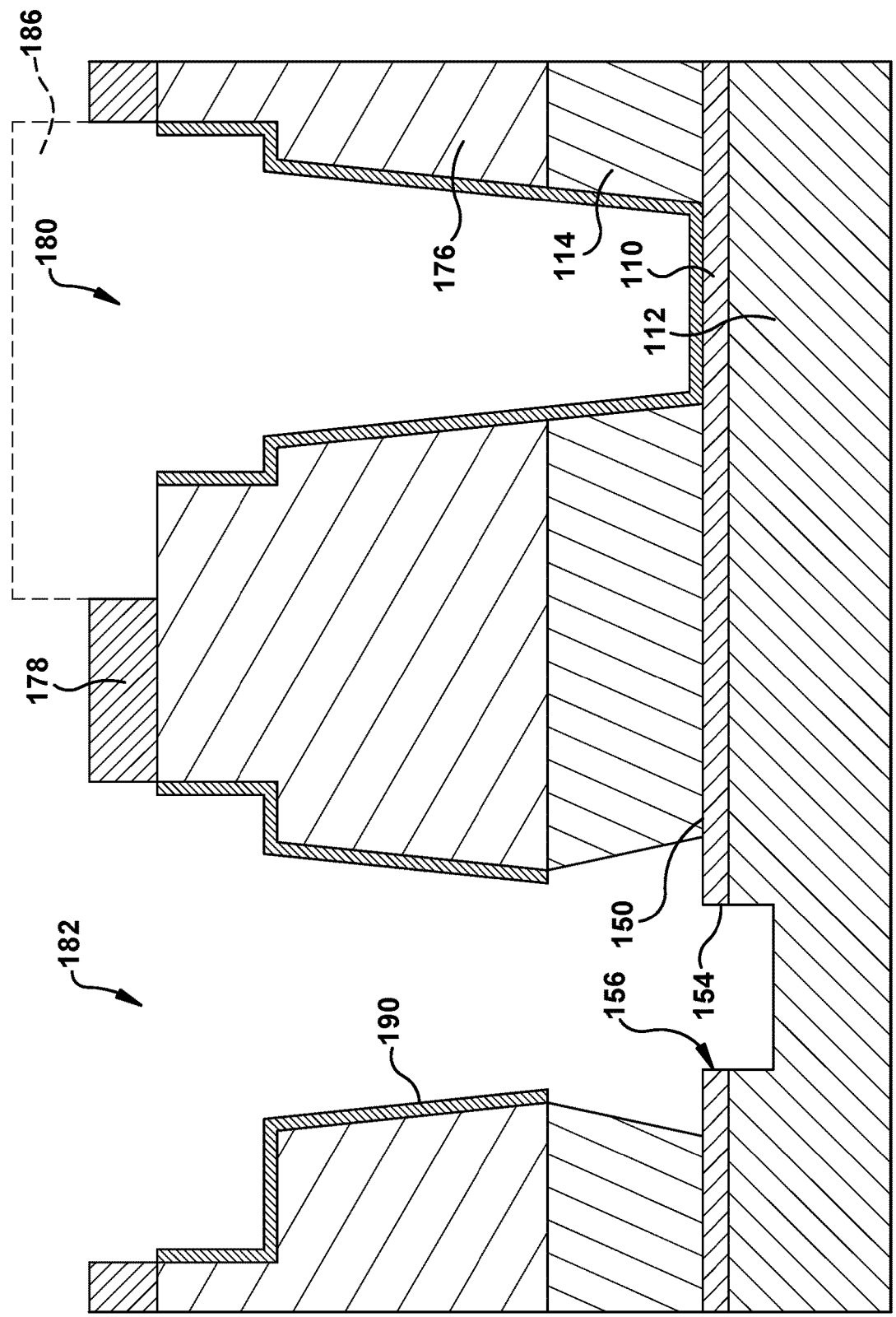
Figure 5D:
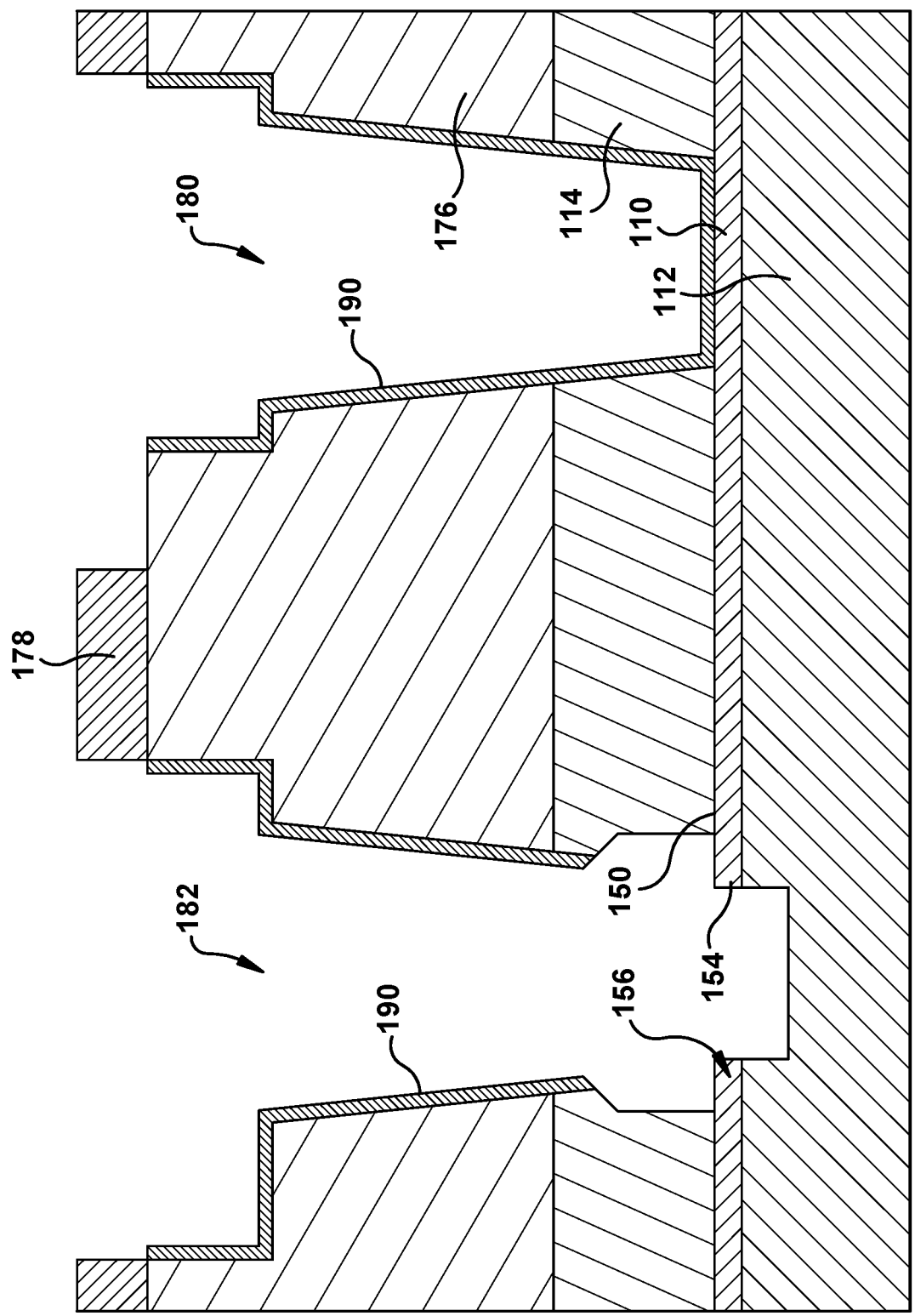
Figure 5E:
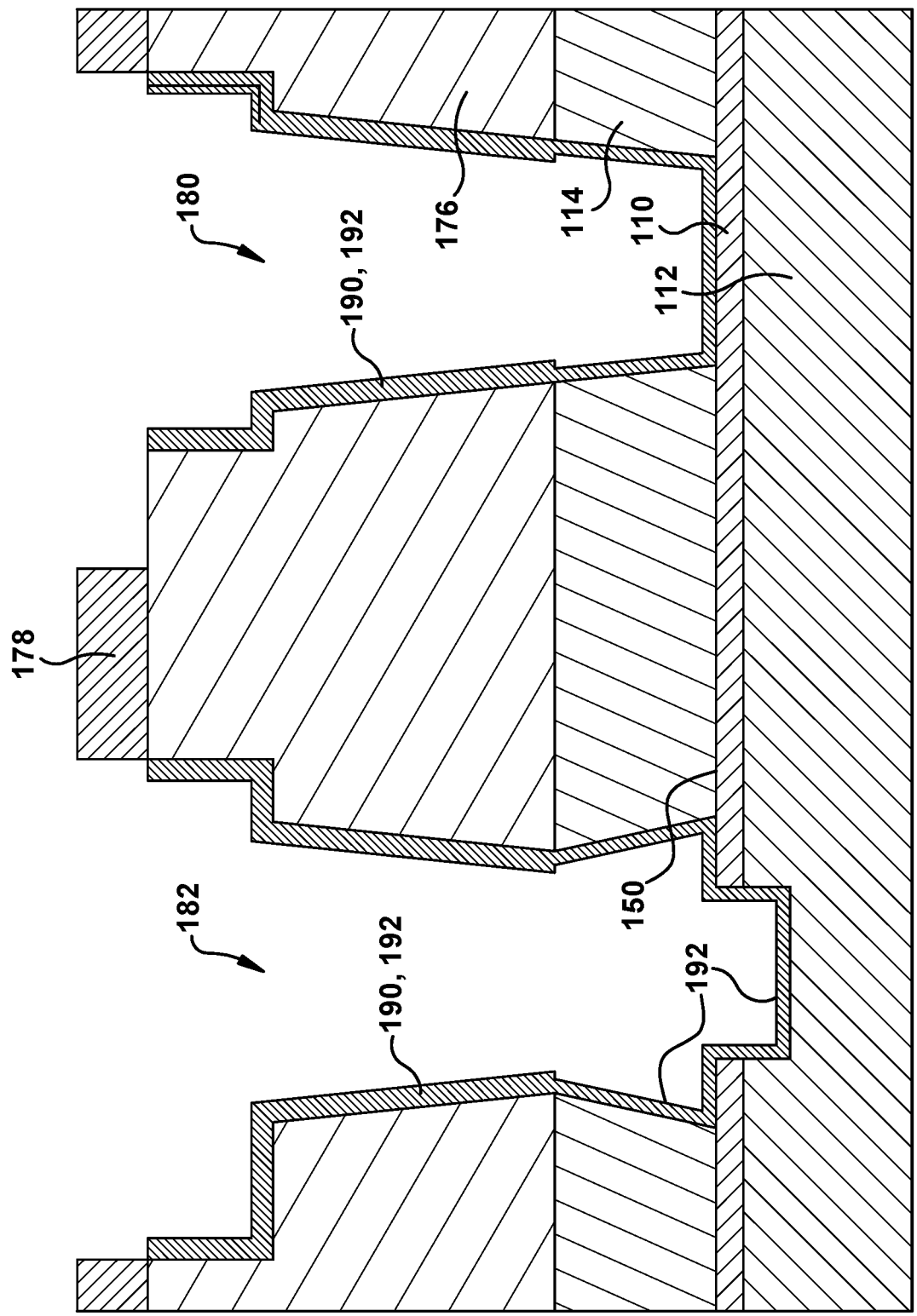
Figure 5F:
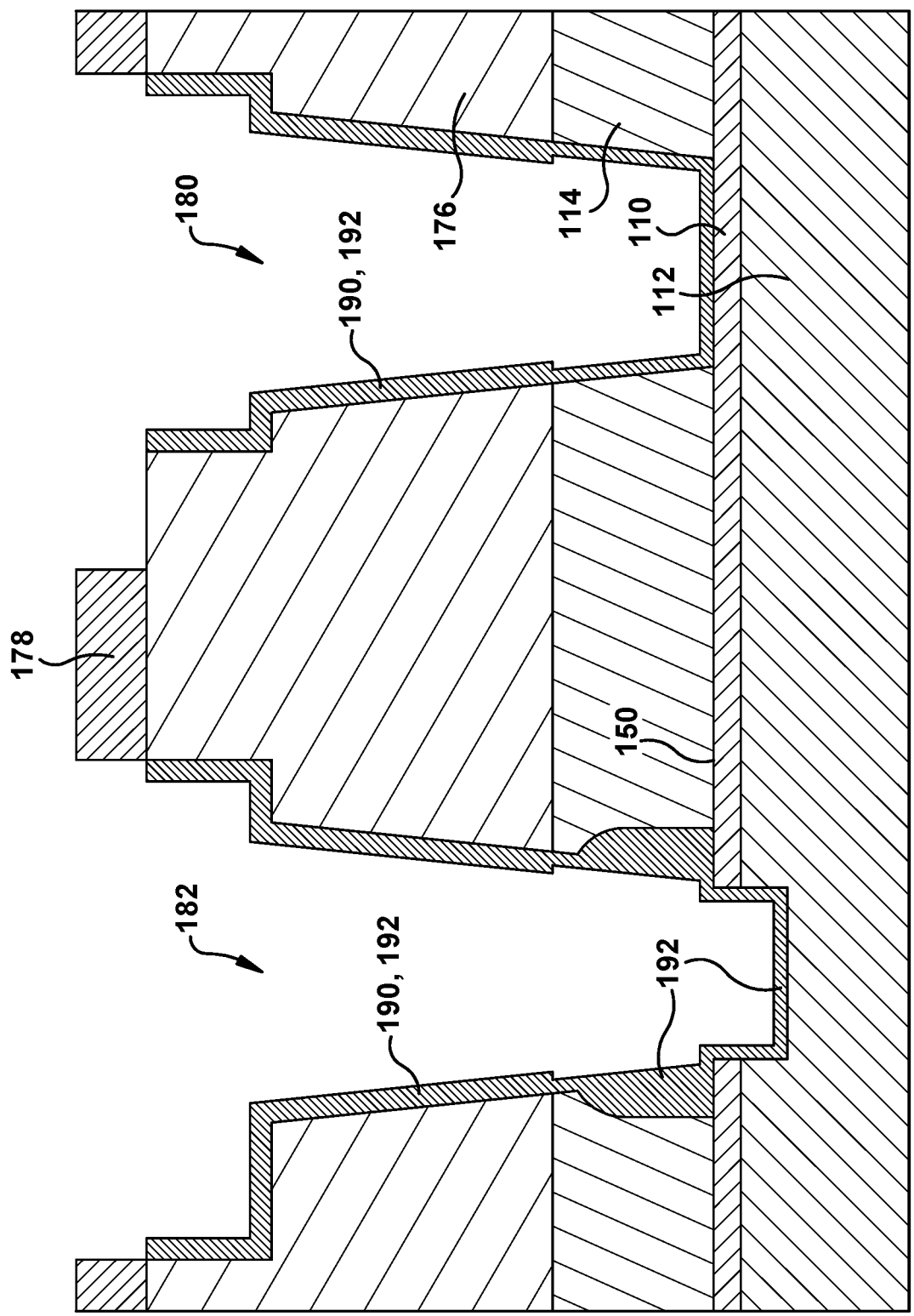

As shown in FIG. 5B, a conductive liner 190 may be deposited in openings 180, 182. Conductive liner 190 (hereafter "liner 190") may include any refractory metal liner material appropriate to stop electromigration of the material of a conductive body to be formed therein, as will be described. For example, liner 190 may include but is not limited to: tantalum (Ta), tantalum nitride (TiN), titanium nitride (TiN), ruthenium (Ru), cobalt (Co), tungsten (W), iridium (Ir), rhodium (Rh), platinum (Pt), and a mixture thereof. In FIG. 5C, an etch back is performed which enlarges opening 182 for conductive pillar, such as second conductive pillar 142 (FIGS. 1-4) (shown in FIG. 5C) or conductive pillar 232 (FIGS. 3-4). The etch back also removes liner 190 at a bottom of opening 182. Where etch back is not desired, such as opening 180 for conductive pillar 132 in FIGS. 1-2, those pillars can be optionally covered by a mask 186 (dashed box in FIG. 5C), which can be removed after the etching. After the etch, wherever the etch back occurred, opening 182 extends through TFR layer 110, creating opening 156 in TFR layer 110 having inner surface 154. The duration or strength of the etch back can be controlled to create different sized second openings 182. For example, in FIG. 5C, the etch back undercuts liner 190 into second insulator layer 114 to a certain extent. In other embodiments, shown in FIG. 5D, the etch back undercuts liner 190 and extends opening 182 into second insulator layer 114 to a larger extent than in FIG. 5C. FIGS. 5E and 5F show depositing additional conductive liner 192 to structure shown in the FIGS. 5C-D embodiments, respectively. Additional conductive liner 192 (hereafter "liner 192") may include the same material as liner 190 and may be deposited using the same deposition technique as liner 190. If additional conductive liner 192 is not desired for those conductive pillars (e.g., 132 in FIGS. 1-2) covered during the etch back, mask 186 (dashed box in FIG. 5C) may remain in place until after the additional liner 192 is added to those openings 182 that were etched back. As shown in FIG. 5E-F, liner 192 covers bottom of opening 182. Liner 192 also contacts upper surface 150 of TFR layer 110, i.e., adjacent opening 182. Where mask 186 is removed from openings 180 that were not etched back prior to additional liner 192 deposition, the additional liner 192 deposition may otherwise thicken liner 190. In FIGS. 5E-F, liner 192 coats sides and bottom of second opening 182 above and through TFR layer 110. In FIGS. 5E-F, liner 192 also fills the undercut of liner 190 (to different lateral extents) and extends into second insulator layer 114 above TFR layer 110.

FIG. 2 shows the process after removing mask 178 (FIGS. 5F), and depositing conductor 200 into openings 180, 182 (FIG. 5F) and planarizing to remove excess conductor 200, e.g., chemical mechanical planarization or other planarization technique. Mask 178 may be removed using any appropriate removal process for the mask material used. Conductor 200 forms terminals 130, 140 including conductive pillars 132, 142. Conductor 200 may also form metal wires 170, 172 of terminals 130, 140 where openings 180, 182 include enlarged areas therefor. Otherwise, metal wires 170, 172 may be formed on conductive pillars 132, 142 subsequently in any known fashion. Conductor 200 can be deposited using any appropriate technique for the material use, e.g., chemical vapor deposition for copper. It is noted that while FIG. 2 (and FIGS. 7, 9 and 10) show second conductive pillar 142 having the shape of second opening 182 in FIG. 5F, second conductive pillar 142 can also have the shape of opening 182 in FIG. 5E in any of the embodiments described herein.

Terminals 130 (and 230), 140 each include a conductive body 210, 212 respectively, in liner(s) 190, 192. More particularly, first conductive pillar 132 (and 232) and second conductive pillar 142 each include a conductive liner 190 and/or multiple conductive liners 190, 192, and a conductive body 210, 212 in the conductive liner(s). Conductor 200 that forms conductive bodies 210, 212 for conductive pillars 132 (232), 142 of first and second terminals 130 (230), 140 may include but is not limited to: copper (Cu), aluminum (Al), tungsten (W), tantalum (Ta) or tantalum nitride (TiN). As shown in FIGS. 2 and 4, first and second conductive pillars 132, 232, 142 are formed in contact with TFR layer 110. However, first conductive pillar(s) 232 in FIG. 4 and second conductive pillar(s) 132 in FIG. 2 contact TFR layer 110 and have lateral contact interface 144 having a same shape as outer portion 146 of the respective conductive pillar 232, 142. Outer portion 146 of conductive pillar(s) 232, 142 includes horizontal surface 148 that contacts upper, horizontal surface 150 of TFR layer 110. As shown in FIGS. 2 and 4, horizontal surface 148 of outer portion 146 includes conductive liner 192, i.e., conductive liner 192 contacts upper surface 150 of TFR layer 110. Conductive pillar(s) 232, 142 also includes inner portion 152 extending through TFR layer 110. As noted, in certain embodiments, inner (punch-through) portion 152 of conductive pillar(s) 232, 142 may also contact inner surface 154 of opening 156 in TFR layer 110, creating an L-shaped contact surface 158. However, this is not necessary in all cases. As shown in FIGS. 2 and 4, where conductive pillar(s) 232, 142 have a circular cross-section, the lateral contact interface 144 and outer portion 146 of the second conductive pillar have a ring shape.

It is emphasized that one or more of conductive pillars 132, 232, 142 may not have circular cross-sections. In this case, lateral contact interface 144 of conductive pillar(s) 232, 142 may not be ring shaped but will conform to whatever the cross-sectional shape of outer portion 146 may be and have an open center where inner portion 152 exists, e.g., oval or otherwise elongated to match a trench contact. Similarly, lateral contact interface 134 of first conductive pillar 132 (FIGS. 1-2) may have a non-circular shape, e.g., oval or otherwise elongated for matching a trench contact.

As shown in FIGS. 1 and 3, and as will be further described, a thickness T, lateral size (X and/or Y1 dimensions) and/or shape of fuse link 102 can be user selected to determine required current and duration to program fuse 100. For example, a dimension Y1 of TFR layer 110 between conductive pillar(s) 132 or 232 and conductive pillar(s) 142 may be customized to control the current required to program fuse 100. That is, a distance Y1 between conductive pillar(s) 132 or 232 and conductive pillar(s)142 can be selected to control the current required to program fuse 100. Typically, a smaller distance Y1 between conductive pillars 132 or 232 and 142 requires less current to program fuse 100.

Figure 6:
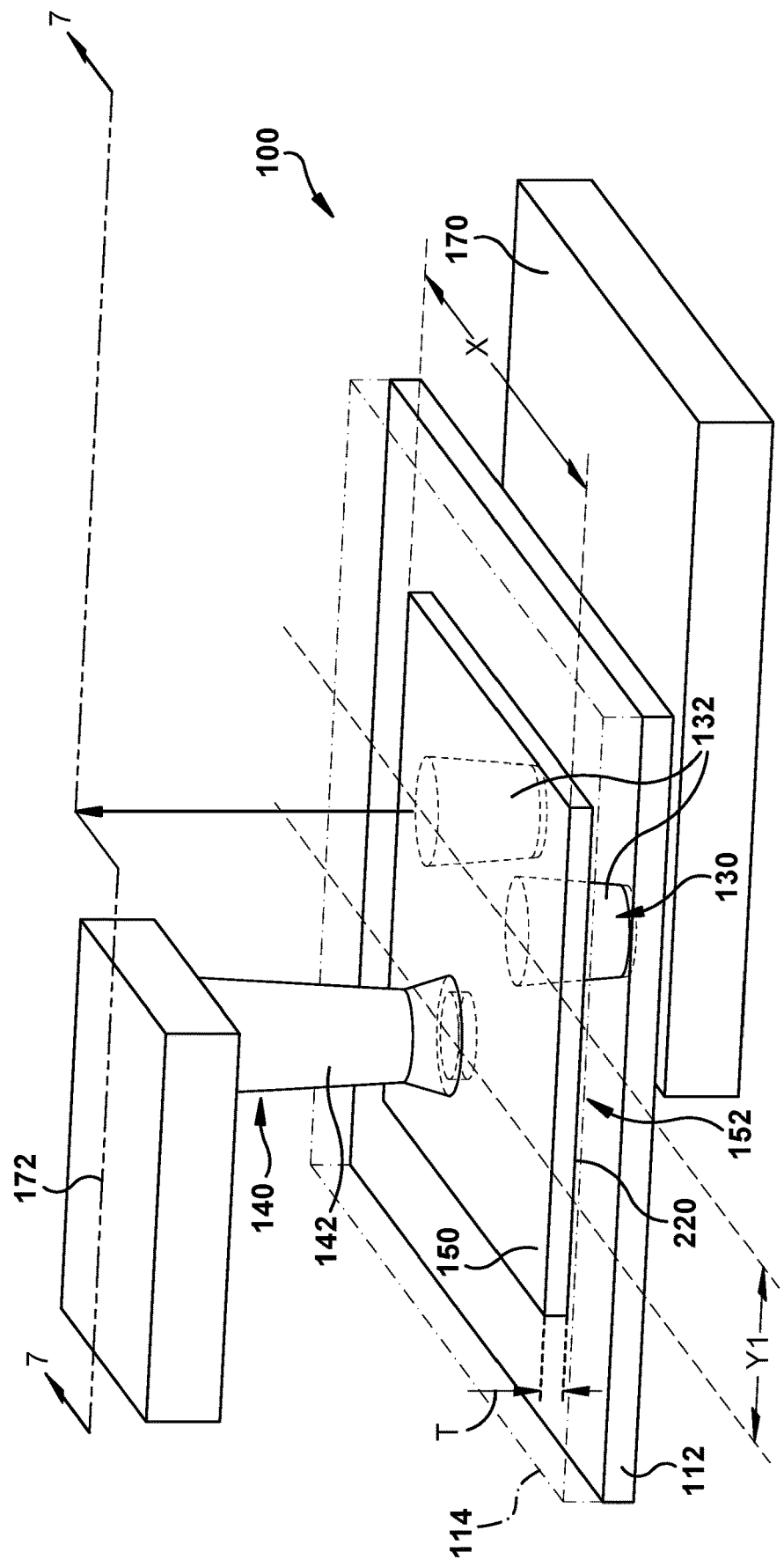
FIG. 6 shows a perspective view of an OTP fuse, according to other embodiments of the disclosure.
Figure 7:
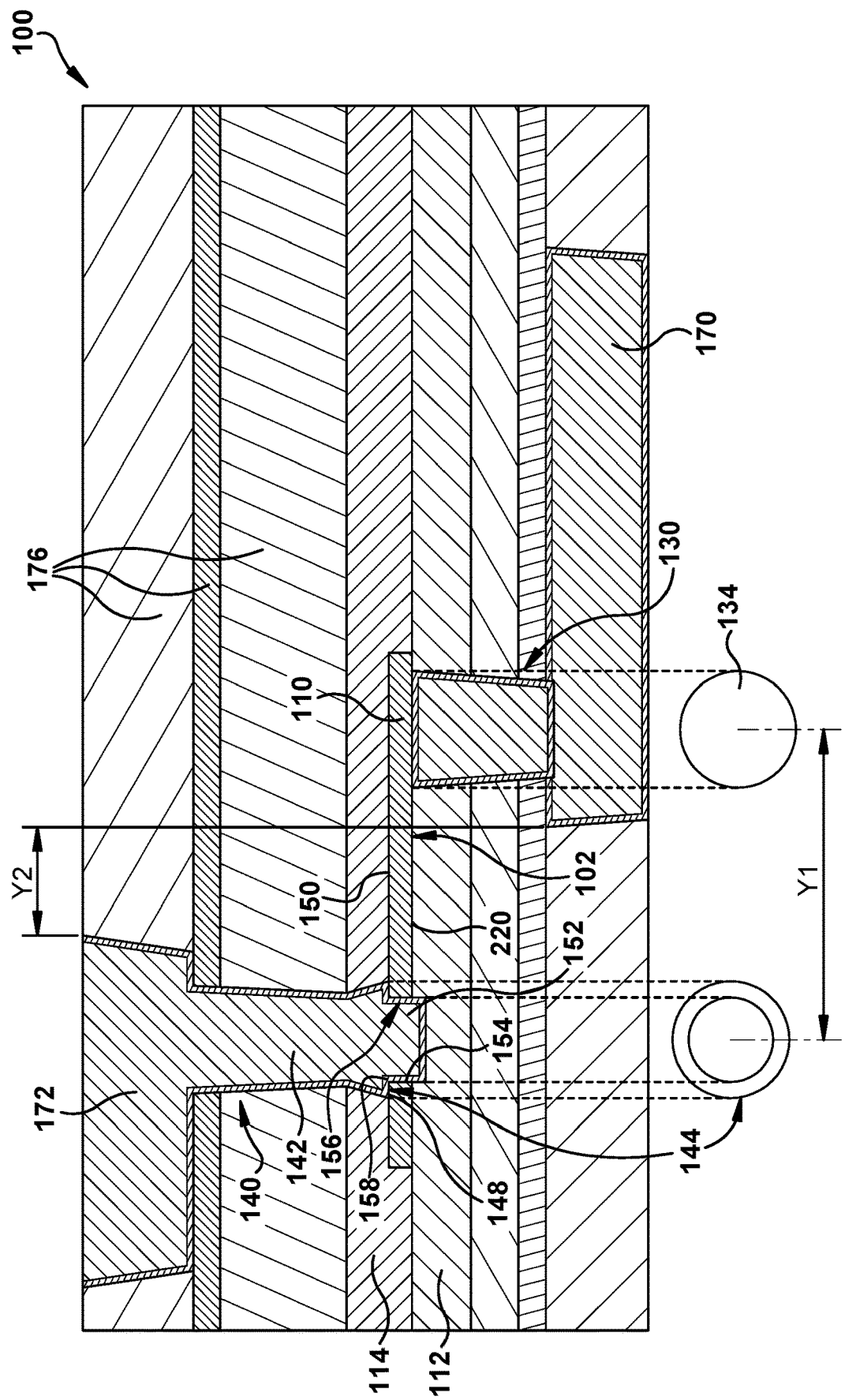
FIG. 7 shows a cross-sectional view of the OTP fuse along view line 7-7 in FIG. 6.

In FIG. 1-2, first conductive pillar 132 of first terminal 130 contacts upper surface 150 of TFR layer 110, and metal wires 170, 172 are in the same ILD layer(s) 176. Positioning metal wires 170, 172 in the same ILD layer(s) 176 may limit how close they can be together, and hence, impact the required current to program fuse 100. More particularly, limitations on reducing a distance Y2 between metal wires 170, 172 may also limit decreasing distance Y1 between first and second conductive pillars 132, 142 of terminals 130, 140. Hence, limitations on distance Y2 between metal wires 170, 172 may also limit the current required to program fuse 100. To address this challenge, as shown in FIGS. 6-7, in other embodiments, first conductive pillar 132 of first terminal 130 may contact a lower surface 220 of TFR layer 110. Because metal wires 170, 172 are no longer in the same ILD layer, a distance Y1 between conductive pillars 132, 142 may be reduced compared to that of FIG. 1, i.e., distance Y1 in FIG. 7 is less than distance Y1 in FIGS. 1 and 3.

FIG. 8 shows a schematic view of fuse 100 relative to the rest of an IC chip 104 in which it is employed. As noted, fuse 100 may be in any BEOL layer of IC chip 104. That is, as shown FIGS. 1-4, 6 and 7, first insulator layer 112, TFR layer 110, second insulator layer 114 and first and second terminals 130 or 230 and 140 may be in any BEOL layer of IC chip 104. While shown in a particular BEOL layer in FIG. 8, e.g., metal layer M6, fuse 100 can be in any BEOL layer, including, at least in part, metal layers M1-M5 or BEOL layers (not shown) above M6. Fuse 100 may also include an e-fuse driver 174 to direct current therethrough and to program fuse 100. In contrast to the rest of fuse 100, e-fuse driver 174 may be in the FEOL layer of IC chip 104. Hence, e-fuse driver 174 is below first insulator layer 112. One advantage of fuse 100 is that it requires less current to program, e.g., approximately 2.5 milli-Amperes (mA) compared to 10-12 mA for silicide-based OTP fuses. As another advantage, e-fuse driver 174 does not need to be as large as e-fuse drivers for conventional fuses (e.g., in some cases, it can be 25% smaller), which frees up valuable space in the FEOL layer for other structure.

Figure 9:
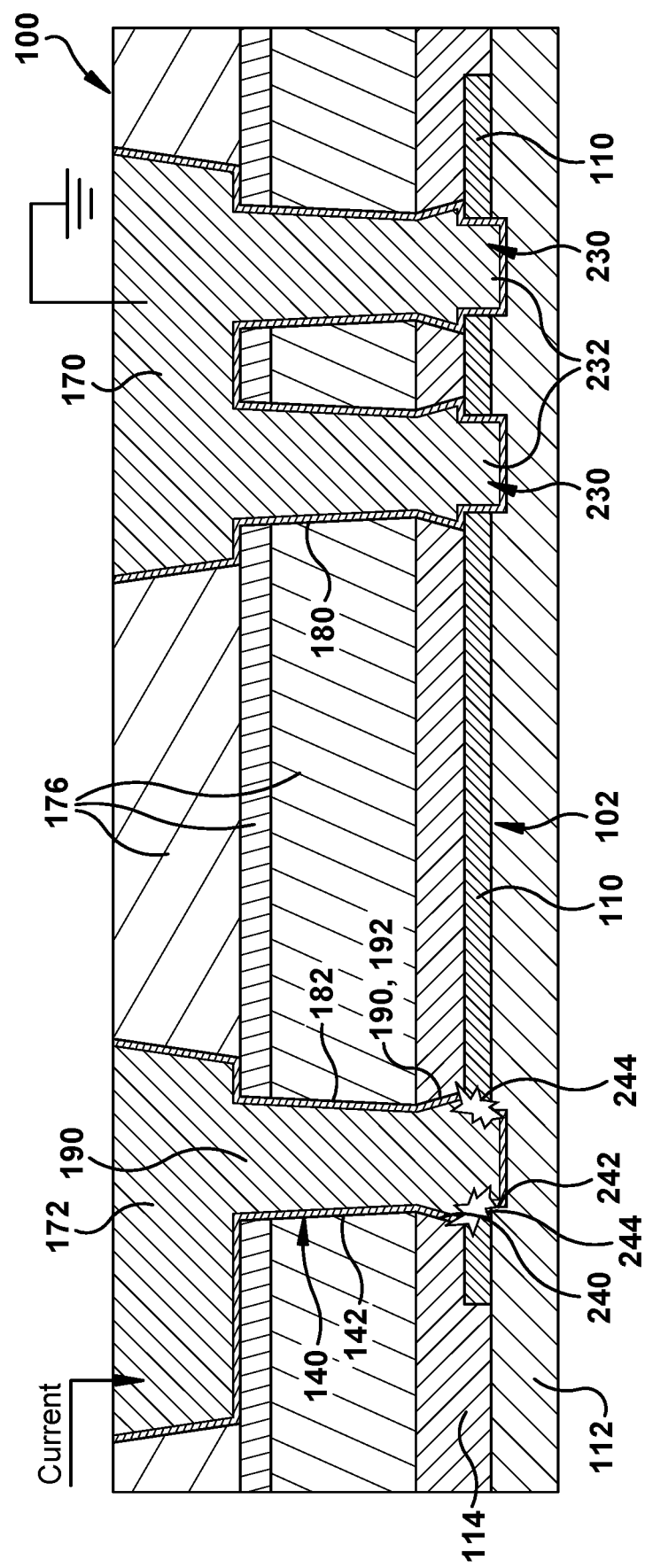
FIG. 9 shows a cross-sectional view of the OTP fuse of FIG. 2 in programmed condition, according to embodiments of the disclosure.

FIG. 9 shows a cross-sectional view of fuse 100 in a programmed condition (based on the FIGS. 3-4 embodiment). A programming of fuse 100 may occur by transmitting a current through second conductive pillar 142, causing TFR layer 110 (between pillars 132 or 232 and 142) and second conductive pillar 142 to rupture contact between second conductive pillar 142 and TFR layer 110 between a (new) lower surface 240 of second conductive pillar 142 and a (new) upper surface 242 of TFR layer 110. Second terminal 132, 232 (latter shown) is coupled to ground. As shown in FIG. 9, in a programmed condition of fuse 100, e-fuse driver 174 has caused sufficient current to pass through fuse 100 such that contact between second conductive pillar 142 and TFR layer 110 is ruptured, creating an opening 244 between (new) lower surface 240 of second conductive pillar 142 and (new) upper surface 242 of TFR layer 110. Opening 244 extends about the entirety of outer portion 146 (FIGS. 2 and 4) of second conductive pillar 142, preventing electric current from passing through fuse 100. The programming of fuse 100 creates a rupture or catastrophic destruction of lateral contact interface 144 (FIGS. 2 and 4) rather than a smaller, less pronounced breakage that would be observed from an electromigration type of programming in conventional fuses. While programming is shown as rupturing second conductive pillar 142, in the FIGS. 3-4 embodiment, programming of fuse 100 may occur whenever conductive pillar(s) 232, 142 is/are ruptured, as described herein.

Figure 10:
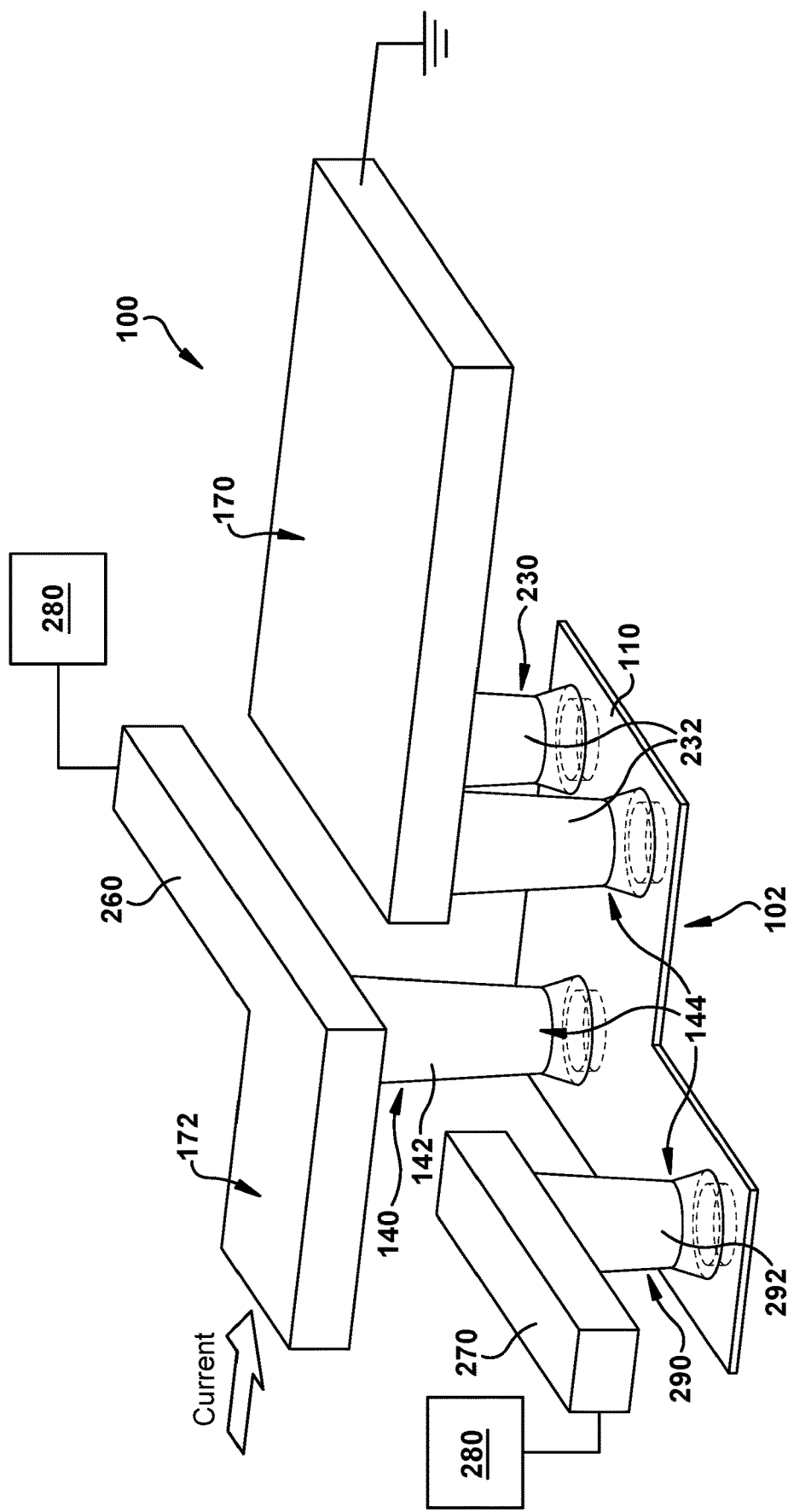
FIG. 10 shows a perspective view of an OTP fuse, according to other embodiments of the disclosure.

FIG. 10 shows a perspective view of fuse 100 in a three (3) terminal configuration according to other embodiments of the disclosure. Thus, FIG. 10 shows an alternative perspective in the way fuse 100 is read/accessed, i.e., instead of it being directly accessed/sensed through respective metal wires 170, 172 coupled to respective conductive pillars 132, 142 as shown in the FIGS. 1-4 embodiments. In this embodiment, fuse 100 is operatively configured in Kelvin's method arrangement, in sensing the contact of second conductive pillar's 142 state whether open (logic 0) or short (logic 1) by the sensing the potential difference between lines 260, 270. Lines 260, 270 may also be referenced as "sense lines". By this Kelvin configuration, since there is no current flow between lines 260, 270, the expected short (un-blown/not-programmed) cell equivalent resistance value will be the contact between conductive pillar 142 to fuse link 102, which is expected to be very small value, e.g., in order of 50-200 Ohms. This very small value of short (logic 1) resistance is more desirable as the reference point of detection can be made equivalently smaller. The principle of programming or blowing fuse 100 remains the same as explained relative to the FIGS. 1-4 embodiments, i.e., by allowing the current force through metal 170, 172 to create an open state (logic 0). As shown, line 260 may be coupled to second terminal 140, and another terminal 290 may be used to couple line 270 to fuse 100, i.e., fuse link 102. Terminal 290 may include a third conductive pillar 292 having the same structure as second conductive pillar 142 (or 232 (FIGS. 3-4), as described herein.

Figure 11:
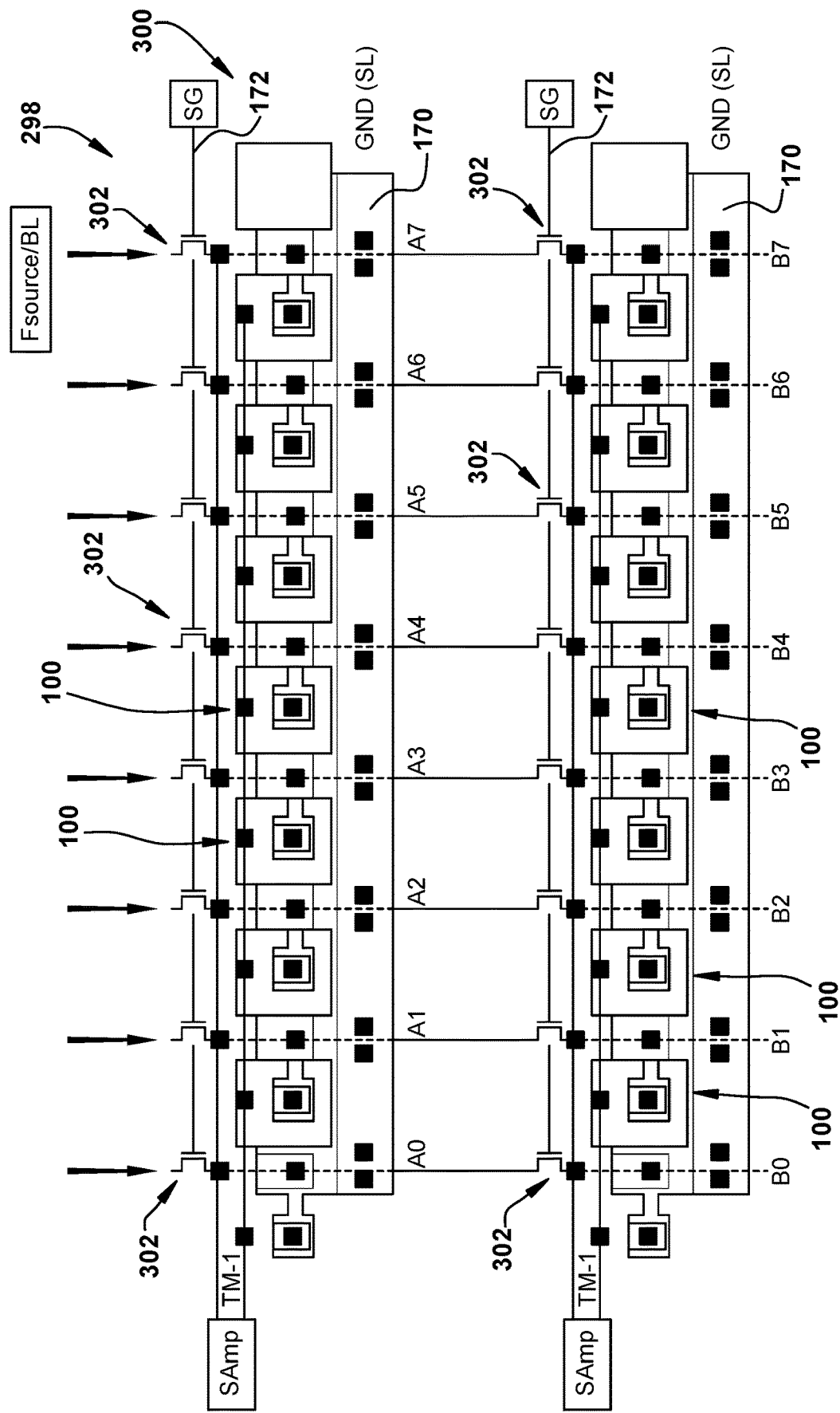
FIG. 11 shows a schematic view of an OTP fuse in one illustrative application of a memory cell, according to embodiments of the disclosure.

FIG. 11 shows a schematic view of an OTP fuse array 298 (8-bit) in one illustrative application of a memory cell 300, according to embodiments of the disclosure. Fuses 100 used in FIG. 11 are as structured in FIG. 10. Memory cell 300 is made up of two rows of eight fuses 100 (only some labeled) with shared metal wire 170 referred to as a source line (SL), and shared metal wire 172 connected to a switch/MOSFET 302 (only some labeled), which is commonly referred to as select gate (SG) or word-line in a 16-bit array) that controls the selection of the row.

Embodiments of the disclosure provide various technical and commercial advantages, examples of which are discussed herein. Fuse 100 can be formed in any BEOL layer(s) rather than in the FEOL layer like current silicide-based OTP fuses, which makes the fuse easier to fabricate and reduces the area required in the FEOL layer. Fuse 100 also requires lower current to program, e.g., approximately 2.5 milli-Amperes (mA) compared to 10-12 mA for silicide-based OTP fuses. Fuse 100, including its driver 174, are also smaller in area compared to conventional silicide-based OTP fuses, allowing a higher density of them in IC chip 104.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A one-time programmable (OTP) fuse, comprising:
a fuse link including a thin film resistor (TFR) layer between a first insulator layer and a second insulator layer;
a first terminal including a first conductive pillar through one of the first and second insulator layers and in contact with the TFR layer; and
a second terminal including a second conductive pillar through one of the first and second insulator layers and in contact with the TFR layer,
wherein the second conductive pillar and the TFR layer have a lateral contact interface having a same shape as an outer portion of the second conductive pillar.

2. The OTP fuse of claim 1, wherein the outer portion of the second conductive pillar includes a horizontal surface that contacts an upper, horizontal surface of the TFR layer, and wherein the second conductive pillar includes an inner portion extending through the TFR layer.

3. The OTP fuse of claim 2, wherein the first conductive pillar and the second conductive pillar each include a conductive liner and a conductive body in the conductive liner, wherein the horizontal surface of the outer portion includes the conductive liner.

4. The OTP fuse of claim 3, wherein the conductive body includes a material chosen from a group comprising: copper (Cu), aluminum (Al), tungsten (W), tantalum (Ta) and tantalum nitride (TiN), and the conductive liner includes a material chosen from a group comprising: tantalum (Ta), tantalum nitride (TiN), titanium nitride (TiN), ruthenium (Ru), cobalt (Co), tungsten (W), iridium (Ir), rhodium (Rh), platinum (Pt), and a mixture thereof.

5. The OTP fuse of claim 1, wherein the TFR layer includes a material chosen from a group comprising: silicon chromium (SiCr), copper nickel (CuNi), copper chromium (CuCr), nickel chromium (NiCr), titanium nitride (TiN), tantalum nitride (TaN), titanium carbide (TiC), silicon carbide (SiC), tungsten carbide (WC), cobalt (Co), nickel (Ni), chromium (Cr), tungsten (W), molybdenum (Mo), and tantalum (Ta).

6. The OTP fuse of claim 1, wherein the second conductive pillar has a circular cross-section, and the lateral contact interface and the outer portion of the second conductive pillar have a ring shape.

7. The OTP fuse of claim 1, wherein the first conductive pillar contacts an upper surface of the TFR layer.

8. The OTP fuse of claim 1, wherein the first conductive pillar contacts a lower surface of the TFR layer.

9. The OTP fuse of claim 1, wherein the first conductive pillar and the TFR layer have a lateral contact interface having a same shape as an outer portion of the first conductive pillar.

10. The OTP fuse of claim 1, wherein, in a programmed condition of the OTP fuse, contact between the second conductive pillar and the TFR layer is ruptured, creating an opening between a lower surface of the second conductive pillar and an upper surface of the TFR layer.

11. The OTP fuse of claim 1, further comprising an e-fuse driver below the first insulator layer, and wherein the first insulator layer, the TFR layer, the second insulator layer and the first and second terminals are located in a back-end-of-line layer of an integrated circuit (IC) chip, and the e-fuse driver is located in a front-end-of-line layer of the IC chip.

12. A one-time programmable (OTP) fuse, comprising:
a first insulator layer;
a fuse link including a thin film resistor (TFR) layer over the first insulator layer;
a second insulator layer over the thin film resistor layer;
a first terminal including a first conductive pillar in contact with the TFR layer;
a second terminal including a second conductive pillar in contact with the TFR layer, wherein the second conductive pillar has a circular cross-section with an inner portion extending through the TFR layer and an outer ring-shaped portion having a horizontal surface that contacts an upper, horizontal surface of the TFR layer; and
an e-fuse driver below the second insulator layer.

13. The OTP fuse of claim 12, wherein the first conductive pillar and the second conductive pillar each include a conductive liner and a conductive body in the conductive liner, wherein the outer ring-shaped portion of the second conductive pillar includes the conductive liner.

14. The OTP fuse of claim 12, wherein, in a programmed condition of the OTP fuse, contact between the second conductive pillar and the TFR layer is ruptured, creating an opening between a lower surface of the outer ring-shaped portion of the second conductive pillar and an upper surface of the TFR layer.

15. The OTP fuse of claim 12, wherein the first insulator layer, the TFR layer, the second insulator layer and the first and second terminals are in a back-end-of-line layer of an integrated circuit (IC) chip, and the e-fuse driver is in a front-end-of-line layer of the IC chip.

16. The OTP fuse of claim 12, wherein the first conductive pillar has a circular cross-section with an inner portion extending through the TFR layer and an outer ring-shaped portion having a horizontal surface that contacts an upper, horizontal surface of the TFR layer.

17. A method of forming a one-time programmable (OTP) fuse, the method comprising:
forming a first insulator layer;
forming a thin film resistor (TFR) layer over the first insulator layer;
forming a second insulator layer over the thin film resistor layer;
forming a first conductive pillar in contact with the TFR layer; and
forming a second conductive pillar in contact with the TFR layer, wherein the second conductive pillar and the TFR layer have a lateral contact interface having a same shape as an outer portion of the second conductive pillar.

18. The method of claim 16, wherein the first conductive pillar and the second conductive pillar each include a conductive liner and a conductive body in the conductive liner, wherein the lateral contact interface includes the outer portion of the second conductive pillar in contact with an upper surface of the TFR layer and an inner portion of the second conductive pillar extending through the TFR layer.

19. The method of claim 16, further comprising programming the OTP fuse by transmitting a current through the first conductive pillar, the TFR layer and the second conductive pillar to rupture contact between the second conductive pillar and the TFR layer between a lower surface of the second conductive pillar and an upper surface of the TFR layer.

20. The method of claim 16, wherein the first insulator layer, the TFR layer and the second insulator layer are formed in a back-end-of-line layer of an integrated circuit (IC) chip, and further comprising forming an e-fuse driver located in a front-end-of-line layer of the IC chip.

* * * * *